(12) United States Patent
Goh et al.

(10) Patent No.: US 8,164,179 B2
(45) Date of Patent: Apr. 24, 2012

(54) CHIP SCALE PACKAGE STRUCTURE WITH CAN ATTACHMENT

(75) Inventors: Kim-Yong Goh, Singapore (SG); Jing-En Luan, Singapore (SG)

(73) Assignee: STMicroelectronics Asia Pacific PTE Ltd-Singapore, Singapore (SG)

( * ) Notice: Subject to any disclaimer, the term of this patent is extended or adjusted under 35 U.S.C. 154(b) by 271 days.

(21) Appl. No.: 12/336,422

(22) Filed: Dec. 16, 2008

(65) Prior Publication Data
US 2010/0148347 A1    Jun. 17, 2010

(51) Int. Cl.
*H01L 23/12* (2006.01)
(52) U.S. Cl. ............... 257/704; 257/E23.182
(58) Field of Classification Search .......... 257/704, 257/E23.182
See application file for complete search history.

(56) References Cited

U.S. PATENT DOCUMENTS

| | | | | |
|---|---|---|---|---|
| 5,909,057 | A * | 6/1999 | McCormick et al. | 257/704 |
| 6,133,634 | A * | 10/2000 | Joshi | 257/738 |
| 6,645,791 | B2 * | 11/2003 | Noquil et al. | 438/108 |
| 6,772,512 | B2 * | 8/2004 | Tsai et al. | 29/840 |
| 6,784,020 | B2 * | 8/2004 | Lee et al. | 438/106 |
| 7,492,043 | B2 * | 2/2009 | Choi et al. | 257/724 |
| 7,629,682 | B2 * | 12/2009 | Yang et al. | 257/704 |
| 2004/0012083 | A1 * | 1/2004 | Farrell et al. | 257/704 |

* cited by examiner

*Primary Examiner* — Lex Malsawma
(74) *Attorney, Agent, or Firm* — Gardere Wynne Sewell LLP

(57) ABSTRACT

A chip scale package (CSP) device includes a CSP having a semiconductor die electrically coupled to a plurality of solder balls. A can having an inside top surface and one or more side walls defines a chamber. The CSP is housed in the chamber and is attached to the inside top surface of the can. A printed circuit board is attached to the solder balls and to the one or more side walls to provide support to the CSP and to the can. The CSP may be a Wafer-Level CSP. The can may be built from a metallic substance or from a non-metallic substance. The can provides stress relief to the CSP during a drop test and during a thermal cycle test.

11 Claims, 6 Drawing Sheets

CHIP SCALE PACKAGE STRUCTURE WITH CAN ATTACHMENT

FIELD OF THE INVENTION

The invention relates to semiconductor packaging, and more particularly the invention relates to a Chip Scale Package (CSP) with a can attachment.

BACKGROUND

CSPs are used in a wide variety of consumer electronics products. In particular, Wafer-Level CSP (WL-CSP)s are used in mobile phones, PDAs, lap top computers, printers and other applications. The WL-CSP integrated circuit (IC) is attached to a printed circuit board (PCB) by, for example, a conventional surface mount technology. The pads of the IC connect directly to the pads of the PCB through individual solder balls and thus do not require underfill encapsulation material.

The WL-CSP offers several advantages over other types of CSPs (e.g., ball grid array-type, laminate-type). The WL-CSP does not require bond wires or interposer connections between the IC and the solder balls. Since the WL-CSP IC pads connect directly to the PCB, the inductance between IC and the PCB is minimized thereby improving signal quality.

After a device having a WL-CSP attached to a PCB is built, the device is subjected to a drop test to measure its durability. The drop test is a technique for measuring the durability of a component by subjecting it to a free fall from a predetermined height onto a surface under prescribed conditions.

FIG. 1 illustrates a device 100 including a PCB 104 to which is attached a WL-CSP 108 by a plurality of solder balls 112. When subjected to a drop test, the device 100 is deformed due to the impact from a mechanical shock. FIGS. 2 and 3 illustrate the device 100 during a drop impact. As shown in FIGS. 2 and 3, depending on the orientation during the impact, the PCB 104 may be bent upward or downward. The WL-CSP 108 attached to the PCB 104 tends to follow the deformation of the PCB 104, which leads to uneven loading of the solder balls 212.

As WL-CSPs increase in complexity and functionality, the size of the silicon die (not shown) in the WL-CSP 108 and I/O count also increase. As the size of the silicon die (not shown) in the WL-CSP 108 increases, the solder balls at the periphery are subjected to increased loading and deformation because they are farther away from a neutral axis 216. An increase in the thickness of the silicon die (not shown) in the WL-CSP 108 also causes the WL-CSP 108 to become less compliant to bending, resulting in deformation.

The device 100 may also be subjected to a thermal cycle test, which is used to thermally cycle a semiconductor device between hot and cold temperatures to determine the durability of the device. FIG. 4 illustrates the effect on the device 100 during a thermal cycle test. Since the silicon die (not shown) in the WL-CSP 108 expands and contracts at a much lower rate than the PCB 104 during a thermal cycle test, the solder balls 112 at the periphery are subjected to high shear stress, hence resulting in poor test reliability.

Furthermore, a recent trend toward smaller bump pitch of the solder balls 112 has resulted in smaller diameter of the solder balls 112. A smaller bump pitch of the solder balls 112 also results in smaller Under Bump Metallurgy (UBM). Since the UBM opening defines the contact area of the solder balls 112 to the silicon die (not shown) in the WL-CSP 108, a smaller contact area lowers a threshold limit of the solder balls 112 to withstand shear and tensile loads during the drop test and the thermal cycling test.

Unlike a ball grid array (BGA) device that generally has some redundant solder balls as dummy balls to improve the BGA device's drop test and thermal cycling reliability, a WL-CSP device's solder balls are all functional because the WL-CSP device is not designed to accommodate high I/O counts like a BGA device. Consequently, the drop test and thermal cycle test performance of the WL-CSP device cannot generally be improved by adding redundant solder balls.

SUMMARY OF THE DISCLOSURE

A chip scale package (CSP) device includes a CSP having a semiconductor die electrically coupled to a plurality of solder balls. The CSP is housed in a can having an inside top surface and one or more side walls defining a chamber. The CSP is attached to the inside top surface of the can. The CSP may be a Wafer-Level CSP or any other type of CSP.

The can is made from a metallic substance or a non-metallic substance. The side walls of the can are spaced from the CSP by a selected distance. The inside top surface of the can may be square, rectangular or any other shape. In one implementation, an opening is formed on a top surface of the can. The can enhances a drop test performance and a thermal cycle test performance of the CSP device.

BRIEF DESCRIPTION OF THE DRAWINGS

For a more complete understanding of the features, example embodiments and possible advantages of the present invention, reference is now made to the detailed description of the invention along with the accompanying figures and in which.

DETAILED DESCRIPTION OF THE EMBODIMENTS

Figure 1:
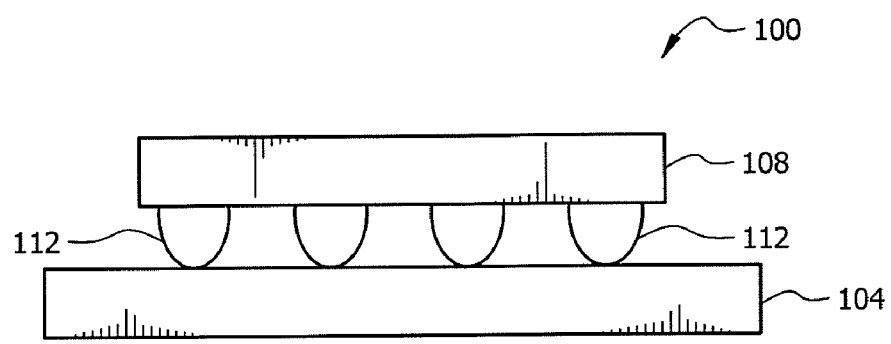
FIG. 1 illustrates a device including a printed circuit board to which is attached a WL-CSP.
Figure 2:
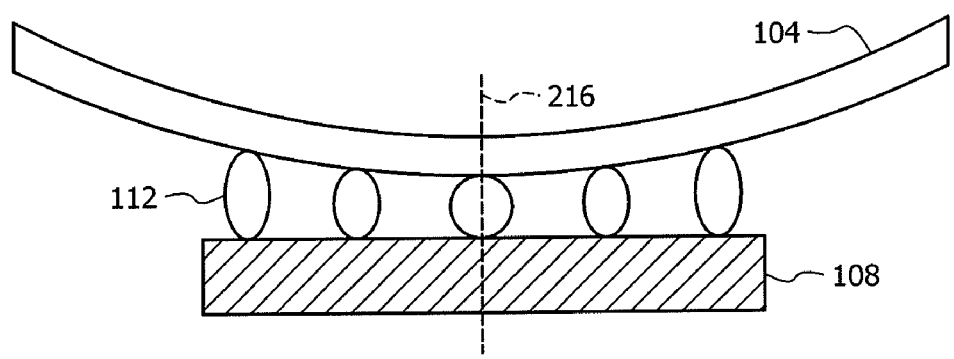
FIGS. 2 and 3 illustrate a device during a drop impact.
Figure 3:
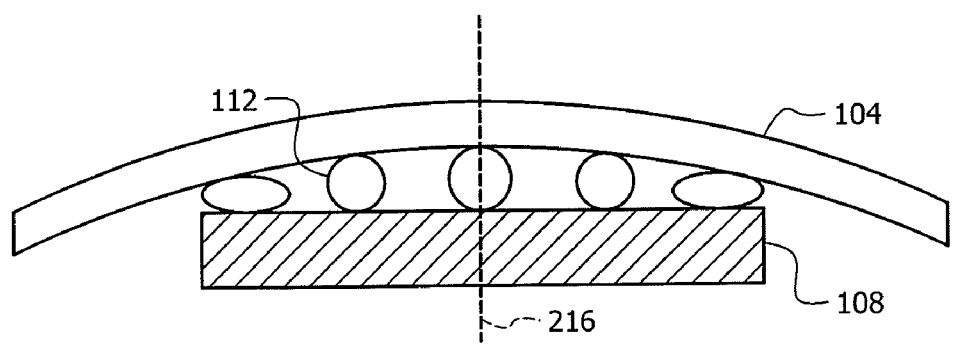
Figure 4:
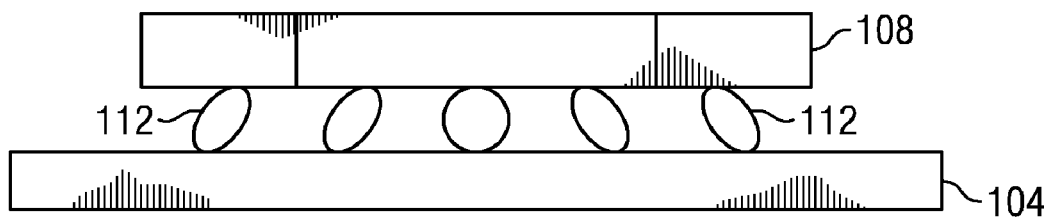
FIG. 4 illustrates a device during a thermal cycle test.
Figure 5:
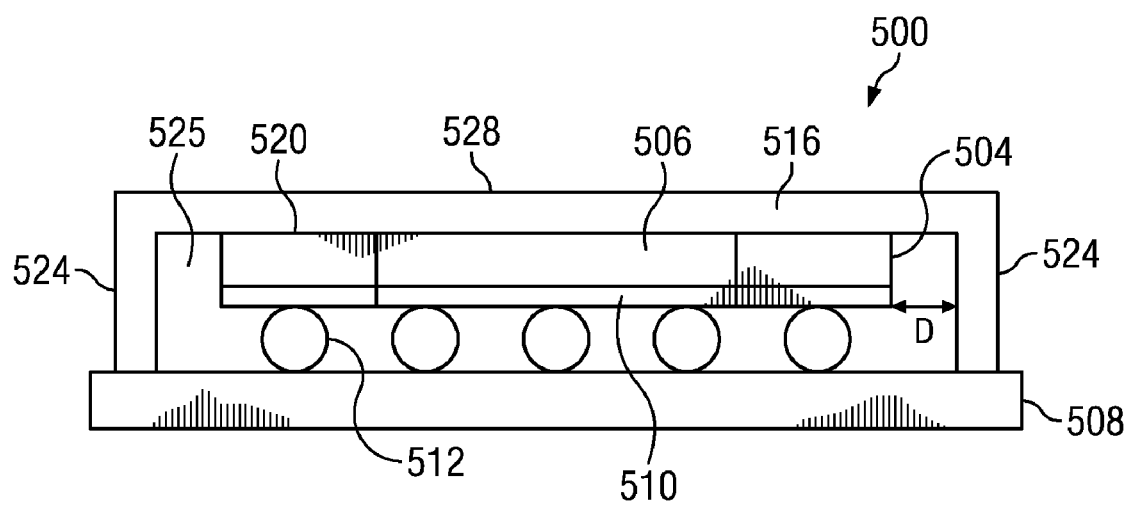
FIG. 5 illustrates a device in accordance with one embodiment.

FIG. 5 illustrates a device 500 in accordance with one embodiment. The device 500 includes a WL-CSP 504. The WL-CSP 504 includes a silicon die 506 on which a metal layer 510 is formed. A plurality of solder balls 512 are attached to the metal layer 510 and are electrically coupled to the silicon die 506.

A can 516 in the form of an open box has a top member 528 and a side member 524. The can 516 is placed over, and attached to, the WL-CSP 504. The can 516 and the WL-CSP 504 are then attached to a PCB 508. As shown in FIG. 5, the WL-CSP, 504 is attached to the PCB 508 via the solder balls 512 and supports the can 516 through the side member 524. The inside top 520 of the can 516 is attached to the WL-CSP 504. Hence, the WL-CSP 504 is enclosed in a cavity 525 defined by the can 516 and the PCB 508.

The side member 524 of the can 516 is spaced from the WL-CSP 504 by a separation distance D. The separation distance D may be varied if desired. In one implementation, the separation distance D may be zero, in which case the side member 524 touches the WL-CSP 504. While the side member 524 is shown to be perpendicular to the top member 528 of the can 516, it will be understood by those skilled in the art the side member 524 may be at other desired angles with respect to the top member 528. The can 516 is made from a metal substance or alternatively from a suitable non-metallic substance, such as a composite, a plastic or glass.

It will be understood by those skilled in the art that while the device 500 is implemented with a WL-CSP, other types of CSPs may also be used with the can 516. It will also be understood that BGA type packages in which a silicon die is encapsulated in an encapsulating compound may also be attached to a can to improve drop test and thermal cycle test performances. Also, any other type of semiconductor die may used instead of a silicon die.

Referring back to FIG. 5, the can 516 alleviates shear and tensile stress experienced by the solder balls 512 at the edges or periphery during a drop test. The can 516 through its side 514 absorbs some of the shear and tensile stress generated during the drop test, thus improving the device 500's drop test performance. Likewise, the can 516 alleviates shear and tensile stress experienced by the solder balls 512 at the edges during a thermal recycle test, thus improving the device 500's performance during the thermal recycle test.

Furthermore, the can 516 adds to the rigidity of the device 500, thus preventing the device 500 from deforming excessively during a drop test. Because a portion of the shear and tensile stress is absorbed by the can 516 during the drop test, the solder balls 512 at the edges or the periphery are subjected to lesser out-of-plane deformation compared to a CSP device without a can attachment.

Moreover, the presence of the can 516 restricts the movement of the silicon die 506 with respect to the PCB 508 during a thermal cycle test. For example, the thermal coefficient of expansion value of the PCB is much closer to the thermal coefficient of expansion value of a metal can (e.g., copper metal can) than the thermal coefficient of expansion value of the silicon die 506 in a WL-CSP. Consequently, the can 516 (i.e., a metal can) expands and contracts at a closer rate to the rate of expansion and contraction of the PCB 508, thus subjecting the solder balls 512 at the edges to be subjected to less shear deformation and stress. Also, the WL-CSP 504 with the can 516 attachment improves the device 500's drop test performance and thermal cycle test performance without requiring redundant solder balls or other expensive solutions such as utilizing a redistributed line (RDL).

Figure 6:
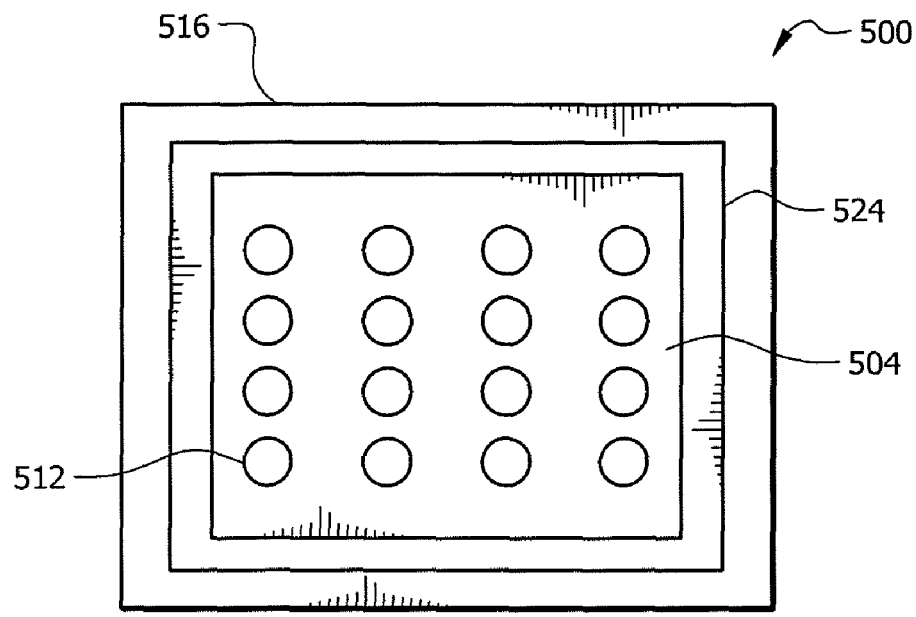
FIG. 6 illustrates a plan view of a CSP device with a metal can attachment in accordance with one embodiment.
Figure 7:
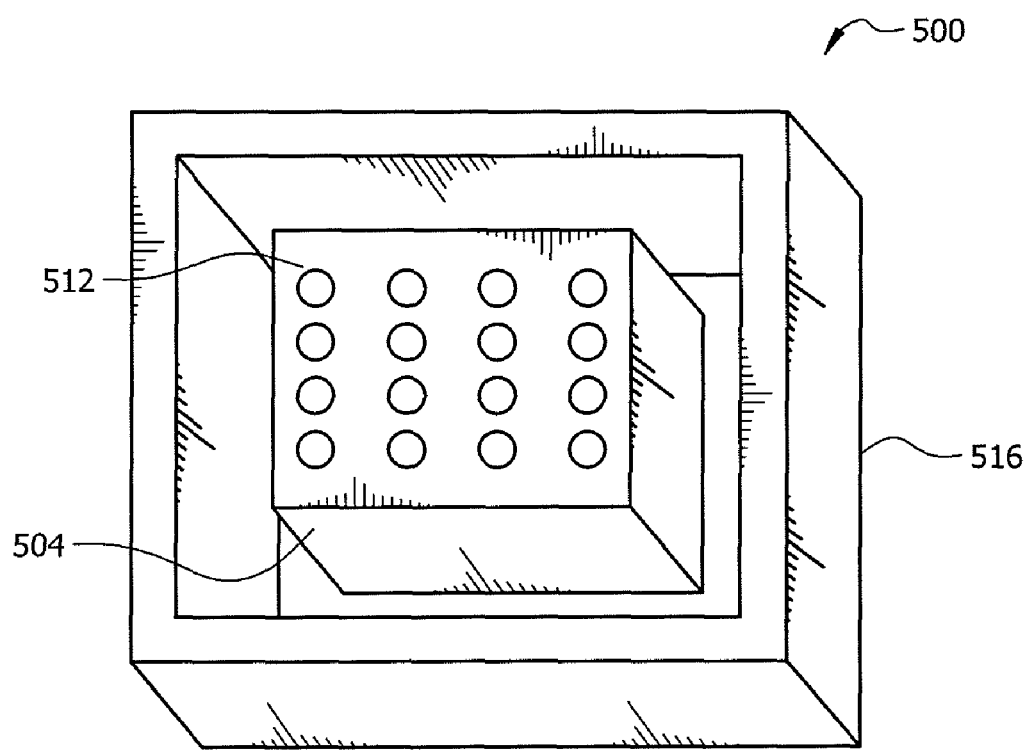
FIG. 7 illustrates a perspective view of a CSP device attached to a metal can.

FIG. 6 illustrates a plan view of the WL-CSP 504 attached to the can 516. The WL-CSP 504 resides inside the cavity 525 of the can 516. While the can 516 is illustrated as having a square shape, it will be understood by those skilled in the art that the can 516 can take other shapes (e.g., rectangular, round). FIG. 7 illustrates a perspective view of the WL-CSP 504 attached to the can 516.

Figure 8:
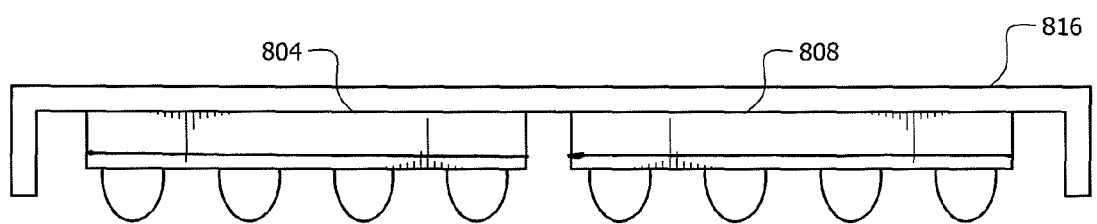
FIG. 8 illustrates an embodiment in which two CSPs are attached to a single metal can.

FIG. 8 illustrates an embodiment in which two CSPs 804 and 808 are attached to a single can 816. Thus, the two CSPs 804 and 808 reside in the cavity of the can 816. The CSPs 804 and 808 may be WL-CSP or any other type of CSPs. It will be understood that more than two CSPS may be attached to a single can. The embodiment of FIG. 8 enables multiple CSPs to have enhanced drop test and thermal cycle test performances. Also, the size of the can 816 may be enlarged to shield selected areas of a PCB (not shown) from electromagnetic interference.

Figure 9:
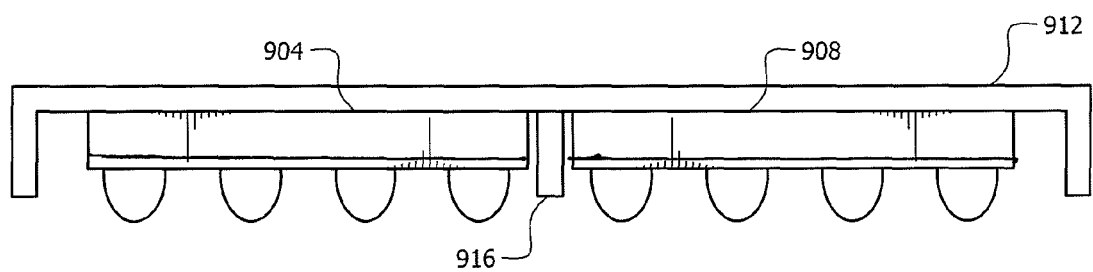
FIG. 9 illustrates another embodiment in which two CSPs are attached to a single metal can.

FIG. 9 illustrates yet another embodiment in which two CSPs 904 and 908 are attached to a single can 912 but the CSPs 904 and 908 are separated from each other by an isolation wall 916. The isolation wall 916 provides EMI isolation of the enclosed CSPs. The CSPs may be WL-CSPs or any other type of CSPs. It will be understood by those skilled in the art that a single can may accommodate more than two CSPs by having additional isolation walls.

Figure 10:
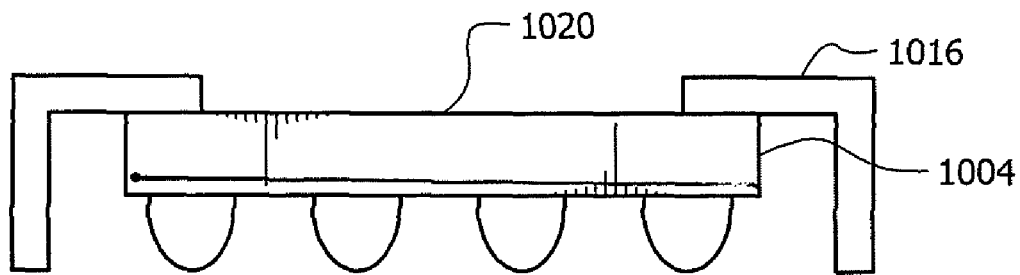
FIG. 10 illustrates another embodiment in which a CSP is attached to a metal can having an opening.

FIG. 10 illustrates yet another embodiment in which a CSP 1004 is attached to a can 1016 having an opening 1020. The opening 1020 is formed about the center of the can 1016.

Figure 11:
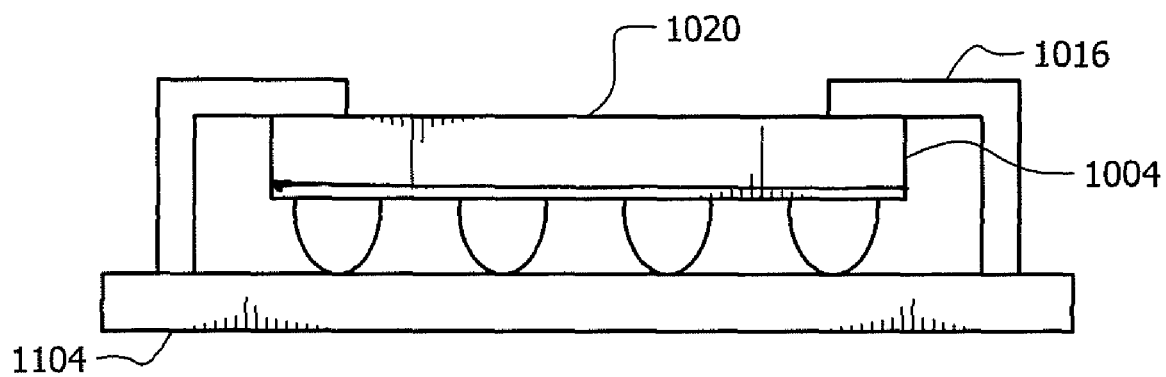
FIG. 11 illustrates a device built by attaching the embodiment shown in FIG. 10.

FIG. 11 illustrates a device built by attaching the embodiment of FIG. 10 to a PCB 1104. The opening 1020 provides additional flexibility to the can 1016 enabling it to bend during a drop test. This additional flexibility due to the opening 1020 enables the device 1100 to withstand greater shear and stress, thus improving the device 1100's drop test and thermal cycling test performances.

There are several advantages of the above-described embodiments. The CSP devices with the can attachment exhibit superior drop test thermal cycle test performances compared to other designs. Various computer simulations were run for a WL-CSP with a metal can attachment of 3.6×6×0.6 mm, F 8×8, 0.4 pitch, 0.25 mm ball, SAC405 solder. The simulation results indicate that the WL-CSP with the metal can attachment reduces peeling stress in solder balls by approximately a factor 2×. Also, the metal can attachment increases characteristic life of a WL-CSP by a factor of 6× compared to other designs. The metal can attachment to the WL-CSP also functions as a heat sink, thus dissipating heat from the silicon die in the WL-CSP. Also, the metal can provides EMI isolation between a WL-CSP and other electronic component in a circuit board, thereby improving the electrical performance of the WL-CSP. The metal can attachment to the WL-CSP makes it unnecessary for a separate EMI shield, which reduces the overall cost of the device.

Figure 12:
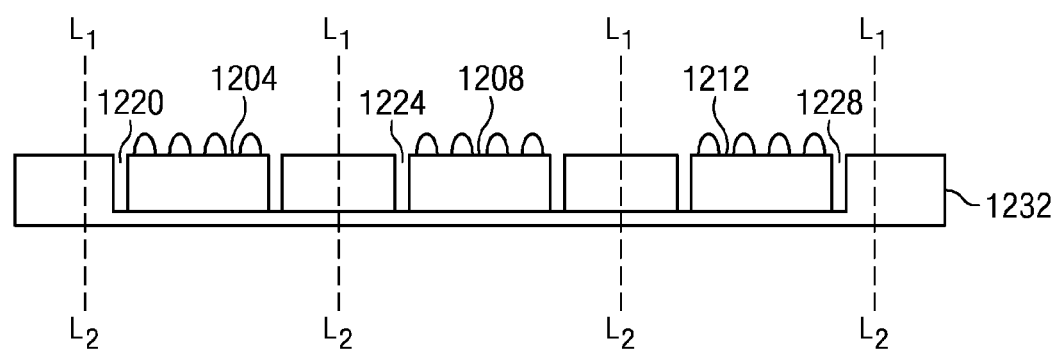
FIGS. 12 and 13 illustrate an exemplary method of manufacturing a CSP device with a metal can attachment in accordance with one embodiment.
Figure 13:
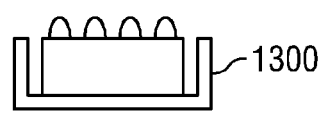

FIGS. 12 and 13 illustrate an exemplary method of manufacturing a CSP device with a metal can attachment in accordance with one embodiment. As shown in FIG. 12, CSP devices 1204, 1208 and 1212 are each attached to a respective chamber 1220, 1224 and 1228 formed on a metal frame 1232. The chambers are each sized to house a CSP device. The metal frame 1232 containing the CSP devices is then sawed or diced along the lines L1-L2 to create singular devices each capped with a metal can. A CSP device 1300 with a metal can attachment created from the process shown in FIG. 12 is illustrated in FIG. 13.

It will also be appreciated that one or more of the elements depicted in the drawings/figures can also be implemented in a more separated or integrated manner, or even removed or rendered as inoperable in certain cases, as is useful in accordance with a particular application.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. Apparatus, comprising:
   a frame including a top member and a plurality of wall members, wherein the plurality of wall members define a plurality of chambers, each chamber having an inside top surface;
   at least one chip scale package in each of the plurality of chambers, each chip scale package having a front surface to which a plurality of solder balls are attached;
   wherein each chip scale package is attached to the inside top surface of the chamber;
   wherein each wall has a length extending at least to the front surface of the attached chip scale package; and
   wherein each wall is configured to permit the frame to be diced through the walls and between the chambers into a plurality of metal cans, each metal can including at least one chamber containing at least one chip scale package, and each can having a peripherally surrounding side wall formed from the diced through walls of the frame.

2. The apparatus according to claim 1, wherein the chip scale package includes a metallic layer formed over a semiconductor die, the solder balls being attached to the metallic layer.

3. The apparatus according to claim 1, wherein the chip scale package is a Wafer-Level chip scale package.

4. The apparatus according to claim 1, wherein the frame is made from a metal substance.

5. The apparatus according to claim 1, wherein the frame is made from a non-metal substance.

6. The apparatus according to claim 1, wherein the peripherally surrounding side walls are spaced from an edge of the chip scale package by a distance.

7. The apparatus according to claim 1, wherein the inside top surface defined by the chamber is square.

8. The apparatus according to claim 1, wherein the inside top surface defined by the chamber is rectangular.

9. The apparatus according to claim 1, wherein the frame further includes an opening formed in the inside top surface that exposes at least a portion of a back surface of a semiconductor die for the chip scale package.

10. The apparatus according to claim 1, wherein the peripherally surrounding side wall has a length extending beyond the front surface of the chip scale package.

11. The apparatus according to claim 10, wherein: each solder ball has a PCB attaching portion for attaching to a surface of a PCB, and the length of the peripherally surrounding side wall extends such that a bottom surface of the one or more side walls is aligned with the PCB attaching portion.

* * * * *